(12) United States Patent
Agashe et al.

(10) Patent No.: US 11,639,906 B2
(45) Date of Patent: May 2, 2023

(54) METHOD AND SYSTEM FOR VIRTUALLY EXECUTING AN OPERATION OF AN ENERGY DISPERSIVE X-RAY SPECTROMETRY (EDS) SYSTEM IN REAL-TIME PRODUCTION LINE

(71) Applicant: SAMSUNG ELECTRONICS CO., LTD., Suwon-si (KR)

(72) Inventors: Shashank Shrikant Agashe, Bangalore (IN); Gaurav Kumar, Bangalore (IN); Priya Ranjan Sinha, Patna (IN); Lakshmi Narayana Pedapudi, Bangalore (IN); Avadhut Dipakrao Chaudhari, Bangalore (IN); Dongwoo Lee, Hwasung-si (KR); Taehyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 190 days.

(21) Appl. No.: 17/185,559

(22) Filed: Feb. 25, 2021

(65) Prior Publication Data
US 2022/0163467 A1     May 26, 2022

(30) Foreign Application Priority Data
Nov. 21, 2020   (IN) .............................. 202041050743

(51) Int. Cl.
*H01J 37/09*     (2006.01)
*G01N 23/2273*   (2018.01)
*G01N 23/2251*   (2018.01)

(52) U.S. Cl.
CPC ..... *G01N 23/2273* (2013.01); *G01N 23/2251* (2013.01); *G01N 2223/335* (2013.01); *G01N 2223/418* (2013.01); *G01N 2223/646* (2013.01)

(58) Field of Classification Search
CPC ............... G01N 23/00; G01N 23/2237; G01N 23/2251; G01N 2223/335; G01N 2223/418; G01N 2223/646; G01N 2223/401; G01N 2223/6116; G01V 10/774; G01V 10/82; G06T 2207/10061; G06T 2207/20081; G06T 2207/20084; G06T 2207/30148;
(Continued)

(56) References Cited

U.S. PATENT DOCUMENTS 5,544,256 A    8/1996  Brecher et al.
5,650,621 A *  7/1997  Tsuneta ................. H01J 37/252
                                               250/311

(Continued)

*Primary Examiner* — Jason L McCormack
(74) *Attorney, Agent, or Firm* — Sughrue Mion, PLLC

(57) ABSTRACT

Provided is a method for virtually executing an operation of an energy dispersive x-ray spectrometry (EDS) system in real time production line by analyzing a defect included in a material undergoing inspection based on computer vision, the method including receiving a scanning electron microscope (SEM) image of the material including the defect, extracting an image-feature from the SEM image of the material, classifying the extracted image-feature under a predetermined label, predicting, based on the classified image-feature, an element associated with the defect included in the material and a shape of the predicted element, and grading the defect included in the material based on comparing the predicted element with a predetermined criteria.

10 Claims, 11 Drawing Sheets

(58) Field of Classification Search
CPC ........ G06T 7/0004; H01L 22/12; H01J 37/00;
H01J 37/02; H01J 37/22; H01J 37/24
USPC ................................. 250/306, 307, 310, 311
See application file for complete search history.

(56) References Cited

U.S. PATENT DOCUMENTS

| | | |
|---|---|---|
| 6,466,895 B1 | 10/2002 | Harvey et al. |
| 6,560,621 B2 * | 5/2003 | Barile .................... G06F 40/143 |
| | | 715/234 |
| 8,682,466 B2 | 3/2014 | Ko et al. |
| 2009/0257645 A1 * | 10/2009 | Chen ............... G01R 31/318511 |
| | | 382/145 |
| 2018/0157933 A1 * | 6/2018 | Brauer .................... G06T 7/001 |
| 2021/0125325 A1 * | 4/2021 | Huang .................. G06T 7/0004 |

* cited by examiner

FIG. 6

| image_id | ground_truth | predicted | image_precision | image_recall | image_f1 |
|---|---|---|---|---|---|
| 1 | ['Am', 'C', 'O', 'Si', 'Sn', 'Ta', 'V', 'W'] | ['Am', 'C', 'O', 'Si', 'Sn', 'Ta', 'V'] | 1.0000 | 0.8750 | 0.9333 |
| 2 | ['Am', 'C', 'O', 'Si', 'Sn', 'Ta', 'W'] | ['Am', 'C', 'O', 'Si', 'Sn', 'Ta', 'V', 'W'] | 0.8750 | 1.0000 | 0.9333 |
| 3 | ['C', 'O', 'Si', 'Sn', 'Ta', 'W'] | ['Am', 'C', 'O', 'Si', 'Sn', 'Ta', 'W'] | 0.8571 | 1.0000 | 0.9231 |
| 4 | ['C', 'O', 'Si', 'Sn', 'Ta', 'V'] | ['Am', 'C', 'O', 'Si', 'Sn', 'Ta', 'V'] | 0.8571 | 1.0000 | 0.9231 |
| 5 | ['C', 'N', 'O', 'Si', 'Ta', 'Ti', 'V'] | ['C', 'N', 'O', 'Si', 'Ti', 'V'] | 1.0000 | 0.8571 | 0.9231 |
| 6 | ['C', 'O', 'Si', 'Sn', 'Ta', 'W'] | ['Am', 'C', 'O', 'Si', 'Sn', 'Ta', 'W'] | 0.8571 | 1.0000 | 0.9231 |
| 7 | ['Am', 'C', 'O', 'Si', 'Sn', 'Ta', 'W'] | ['Am', 'C', 'O', 'Si', 'Sn', 'Ta', 'W'] | 0.8571 | 1.0000 | 0.9231 |
| 8 | ['C', 'O', 'Si', 'Sn', 'Ta', 'W'] | ['Am', 'C', 'O', 'Si', 'Sn', 'Ta', 'W'] | 0.8571 | 1.0000 | 0.9231 |

| Elements | Precision | Recall | F1 |
|---|---|---|---|
| Ta | 0.809524 | 0.954262 | 0.875954 |
| Sn | 0.844444 | 0.945701 | 0.892209 |
| N | 0.832952 | 0.973262 | 0.897657 |

| Average Precision | Average Recall | Average F1 |
|---|---|---|
| 0.69 | 0.84 | 0.75 |

METHOD AND SYSTEM FOR VIRTUALLY EXECUTING AN OPERATION OF AN ENERGY DISPERSIVE X-RAY SPECTROMETRY (EDS) SYSTEM IN REAL-TIME PRODUCTION LINE

CROSS-REFERENCE TO THE RELATED APPLICATION

This application claims priority to Indian Patent Application No. 202041050743 filed on Nov. 21, 2020 in the Indian Intellectual Property Office, the entire disclosure of which is incorporated herein by reference.

BACKGROUND

1. Field

Example embodiments of the present disclosure relate to computing-device based inspection-systems and in particular to computer-vision based inspection-systems for identifying and analyzing defects.

2. Description of Related Art

In semiconductor manufacturing-process, random particle defects are a major source of yield reduction. Knowledge of the source of the particles may be critical in enhancing yield. The defects may be identified using an optical inspection equipment and higher resolution images may be taken using review scanning electron microscope (SEM). Knowledge of material composition (MC) of the defect is important in performing defect source analysis.

Conventionally, a primary method of detecting MC of the defect is through energy dispersive x-ray spectroscopy (EDS). However, this method is time consuming and a potentially destructive method that can damage the internal structure of the wafer. Thus, there is a need to predict the composition of the defect using SEM images that eliminates or reduces the issues of EDS and is more accurate.

In related art, as illustrated in FIG. 1A, in an image processing unit (IPU), a silicon wafer with a diameter that is greater than 300 mm is photographed. A single set of wafers may include 25 wafers and each wafer may include 5 dies. One die may include about 10 to 100 points of inspection. At step 2, measurement and inspection of the silicon wafers may be performed which may include 400 to 600 steps. in FIG. 1B, the defects are detected and locations of the defects in term of position coordinate is obtained. Further, the layer of occurrence and the time of occurrence of the defect may be obtained. In FIG. 1C, the SEM identifies the silicon wafer at high-resolution images. in FIG. 1D, EDS based elemental analysis is executed on certain areas. The interaction between a source of X-ray excitation and a sample may be analyzed. The depth from where the X-rays originate depends on the material The defect image may be two dimensional (2D) while the input data fed to the EDS is directed to the defect volume and is three dimensional (3D). Input defects may have random shape, size, and texture. Defects may not have discernible physical regions associated with specific materials.

Yet another constraint in related art is that diverse appearances of defects are based on source of origin, even when the overall material composition is the same. This may be at least due to changes in the background layout as well as the defect itself.

Further, diverse appearances of defect may be based on relative-composition of different materials, even when the overall material-composition is the same.

SUMMARY

One or more example embodiments provide a computing-device based inspection-systems and in particular to computer-vision based inspection-systems for identifying and analyzing defects.

According to an aspect of an example embodiment, there is provided a method for virtually executing an operation of an energy dispersive x-ray spectrometry (EDS) system in real time production line by analyzing a defect included in a material undergoing inspection based on computer vision, the method including receiving a scanning electron microscope (SEM) image of the material including the defect, extracting an image-feature from the SEM image of the material, classifying the extracted image-feature under a predetermined label, predicting, based on the classified image-feature, an element associated with the defect included in the material and a shape of the predicted element, and grading the defect included in the material based on comparing the predicted element with a predetermined criteria.

According to another aspect of an example embodiment, there is provided a system for virtually executing an operation of an energy dispersive x-ray spectrometry (EDS) system in real time production line by analyzing a defect included in a material undergoing inspection based on computer-vision, the system including at least one processor configured to implement a receiving module configured to receive a scanning electron microscope (SEM) image with respect to the material including the defect, and a processing module configured to extract an image-feature from the SEM image, classify the extracted image-feature under a predetermined label, predict, based on the classifying, an element associated with the defect included in the material and a corresponding shape of the predicted element, and grade the defect included in the material based on comparing the predicted element with a predetermined criteria.

According to yet another aspect of an example embodiment, there is provided a a system for virtually executing an operation of an energy dispersive x-ray spectrometry (EDS) system in real time production line by analyzing a defect included in a material undergoing inspection based on computer-vision, the system including at least one processor configured to implement a receiving module configured to receive a scanning electron microscope (SEM) image with respect to the material including the defect, and a processing module configured to extract an image-feature from the SEM image, classify the extracted image-feature under a predetermined label, predict, based on the classifying, an element associated with the defect included in the material and a corresponding shape of the predicted element, and grade the defect included in the material based on comparing the predicted element with a predetermined criteria, wherein the real time production line includes an inspection unit configured to inspect a wafer to identify the defect included in the wafer for an initial inspection, and a conveyance system configured to communicate the wafer and the identified defect to a scanning electron microscope (SEM.

BRIEF DESCRIPTION OF DRAWINGS

The above and/or other features, aspects, and advantages of example embodiments will become better understood when the following detailed description is read with reference to the accompanying drawings, wherein:

FIG. 6 illustrates experimental results in accordance with an example embodiment.

DETAILED DESCRIPTION

Figure 1A:
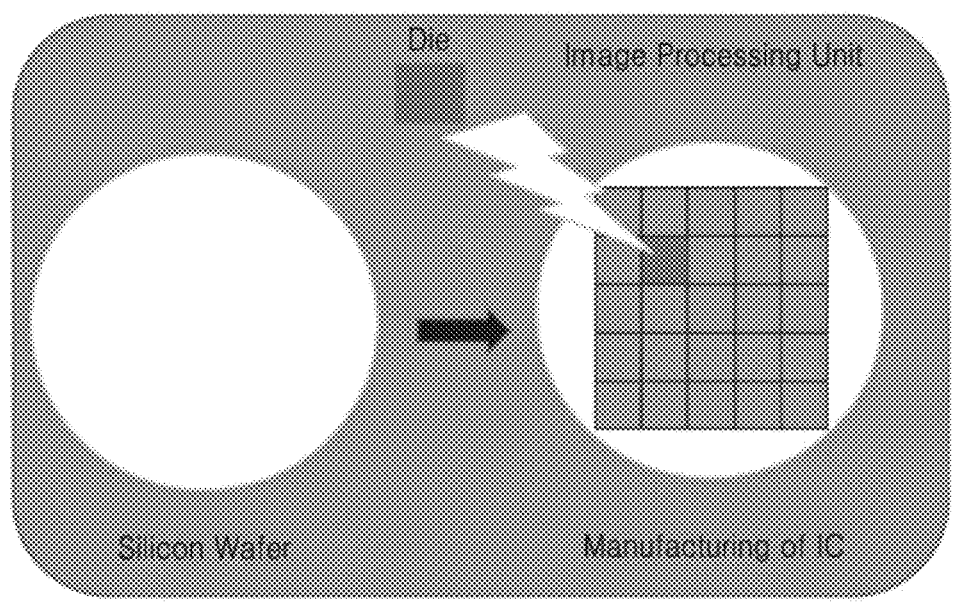
FIGS. 1A, 1B, 1C, and 1D illustrate a method of related art.
Figure 1B:
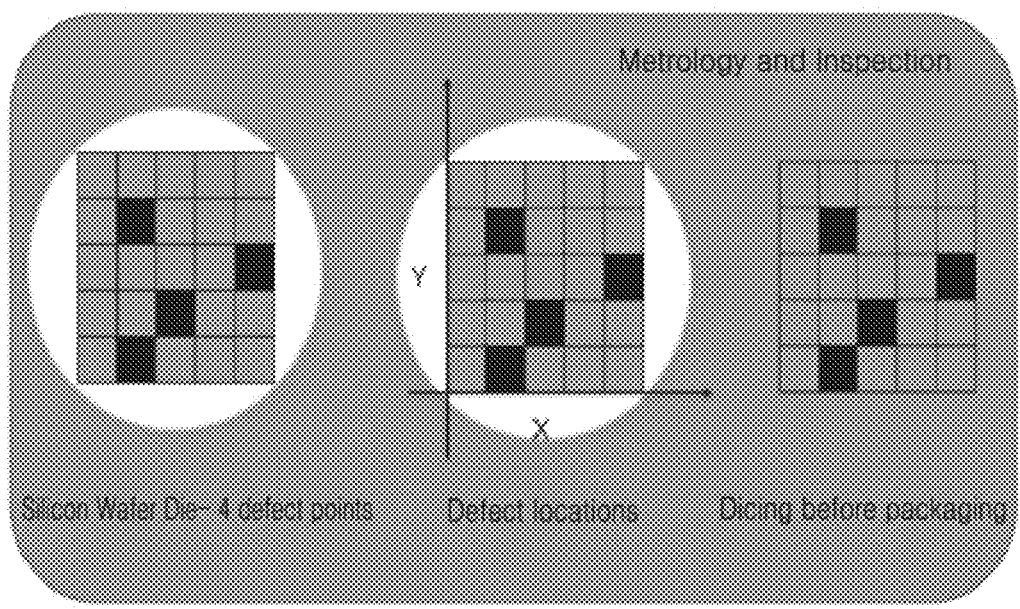
Figure 1C:
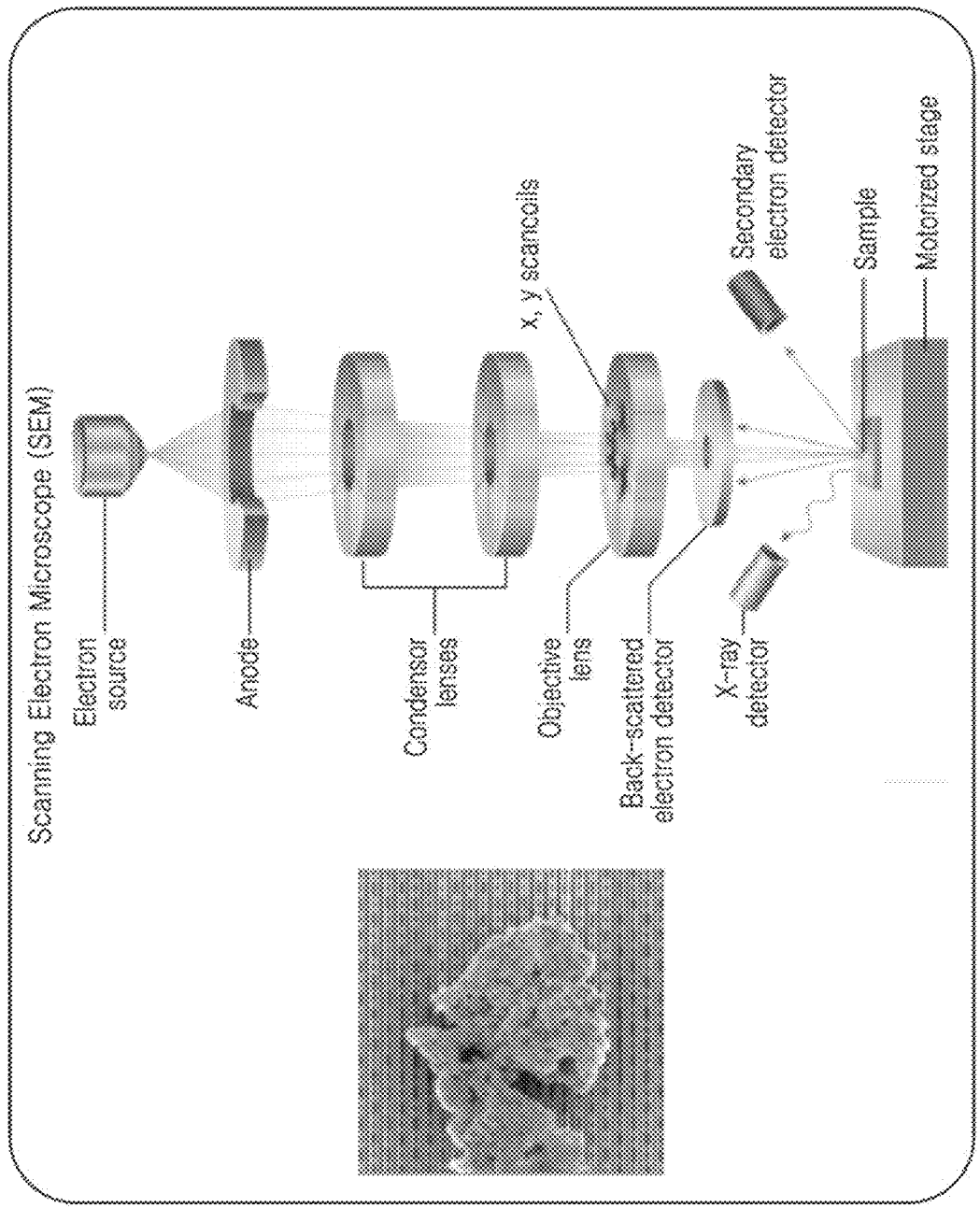
Figure 1D:
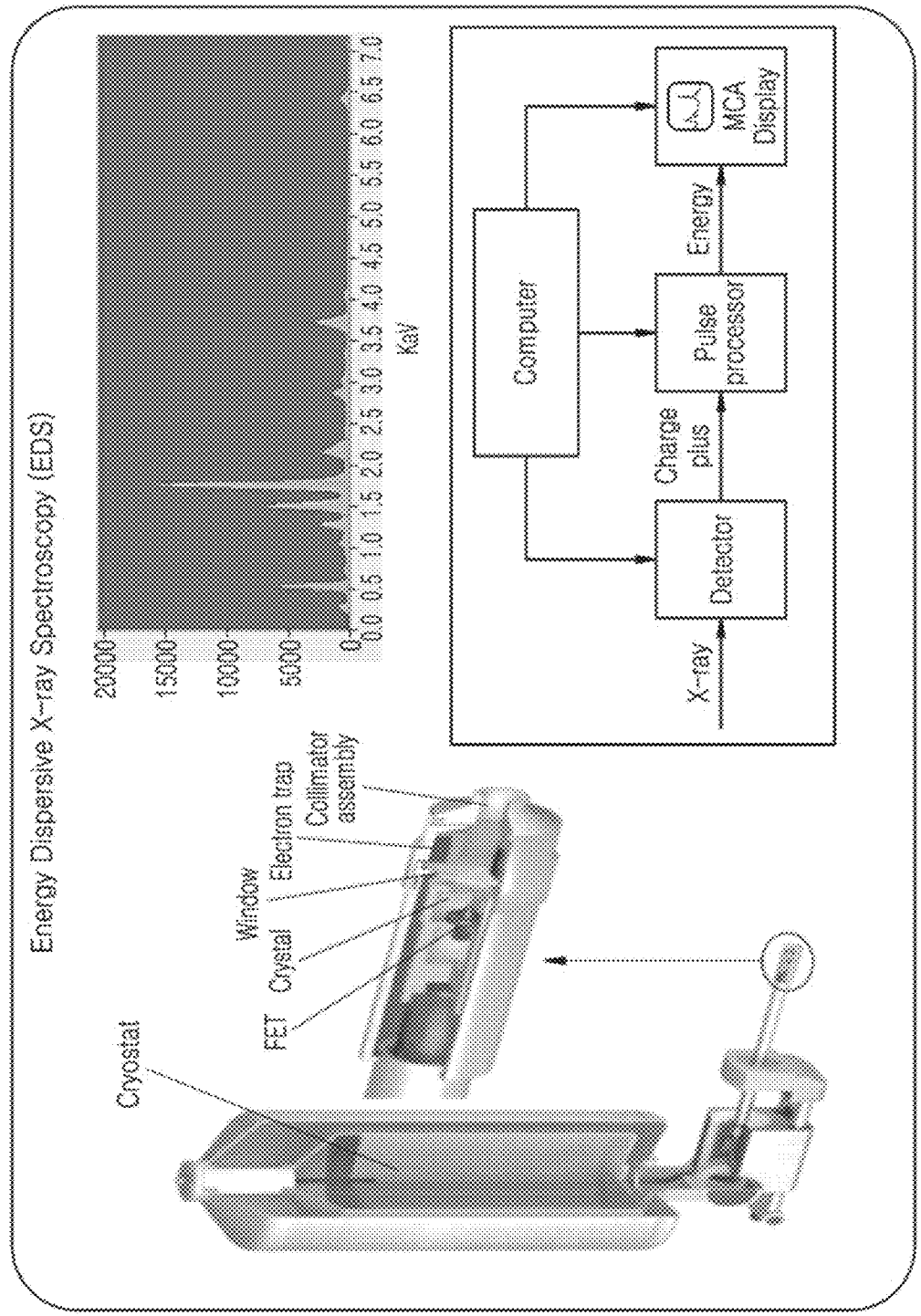

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects.

Further, skilled artisans will appreciate that elements in the drawings are illustrated for simplicity and may not have been necessarily been drawn to scale. For example, the flow charts illustrate the method to help to improve understanding of aspects of example embodiments. Furthermore, in terms of the construction of the device, one or more components of the device may have been represented in the drawings by conventional symbols, and the drawings may show only those specific details that are pertinent to understanding the example embodiments.

It will be understood by those skilled in the art that the foregoing general description and the following detailed description are examples and are not intended to be restrictive thereof.

Reference throughout this specification to "an aspect", "another aspect" or similar language may mean that a particular feature, structure, or characteristic described in connection with an example embodiment is included in at least one example embodiment. Thus, appearances of the phrase "in an example embodiment", "in another example embodiment" and similar language throughout the present disclosure may, but not necessarily, refer to the same example embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Unless otherwise defined, all technical and scientific terms used herein have the same meaning as commonly understood by one of ordinary skill in the art. The system, methods, and examples provided herein are illustrative only and not intended to be limiting.

Example embodiments will be described below in detail with reference to the accompanying drawings.

Figure 2A:
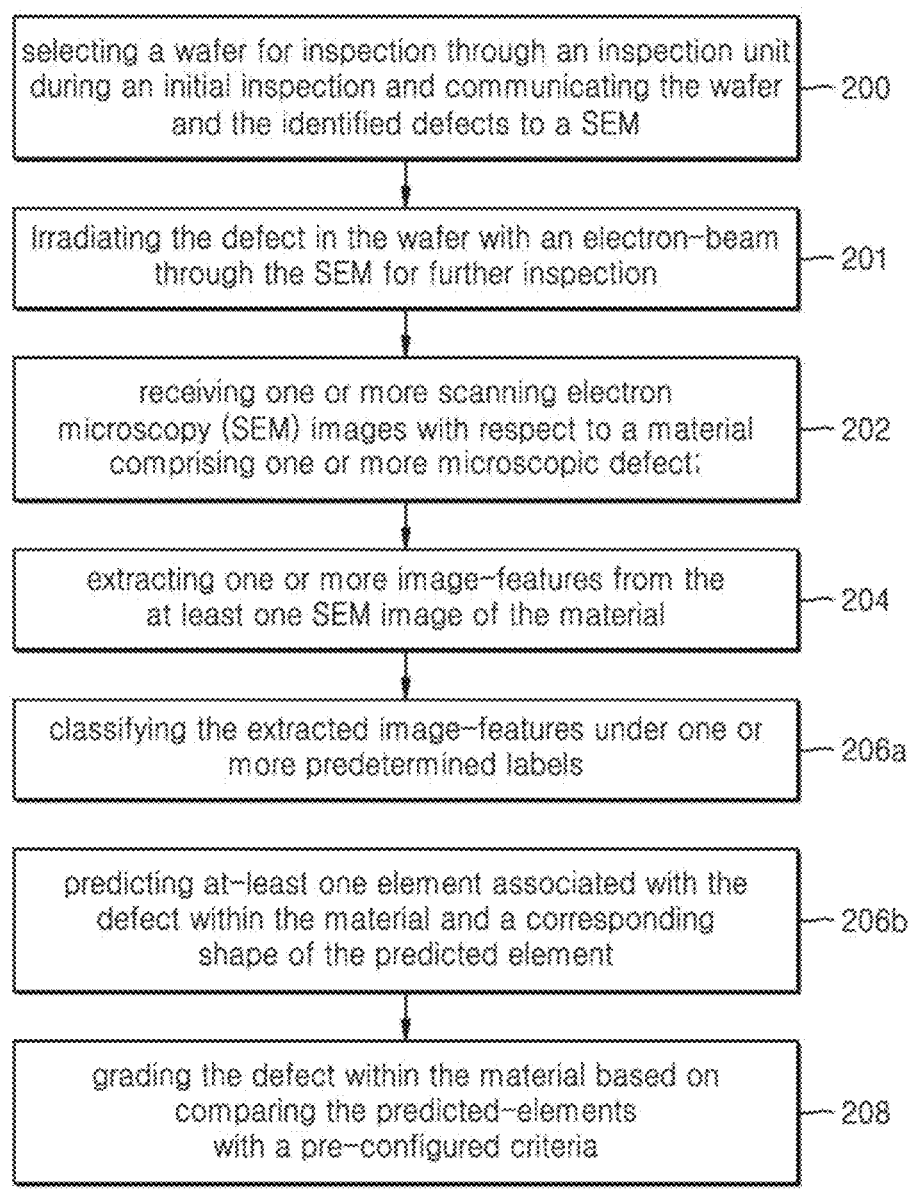
FIGS. 2A and 2B illustrate a computer-vision based inspection method to identifying and analyze defects in accordance with an example embodiment.

FIG. 2A illustrates a method for virtually executing an operation of an EDS system in real time production line by analyzing defects in a material undergoing inspection based on computer vision.

The method may include selecting at-least one wafer for inspection through an inspection unit for identifying defects in an entire wafer during an initial inspection, and communicating the wafer and the identified defects to a SEM at step 200. At least one material comprising the defect included in the wafer may be irradiated with an electron-beam through the SEM for further inspection at step 201. The irradiation may include irradiating the material through an electro-optic system configured to radiate an electron beam on the material to be inspected to thereby enable detection of secondary-electrons by a secondary-electron detector configured to detect secondary electrons generated from the object in response to the electron beam and thereby generate one or more SEM image.

Further, at step 202, one or more SEM images with respect to a material comprising one or more microscopic defect may be received. The SEM images may be pre-processed to be converted into a modified SEM image at least based on image-enhancement based pre-processing and/or estimation of defect-height based on image processing, etc., to capture substantially finer image-features than a related EDS system.

Further, at step 204, one or more image-features from at least one SEM image of the material may be extracted. The extracting of image-features may include executing a deep learning/machine learning framework to extract the image-features by finding contour-features including area, perimeter, centroid, and bounding box. In another example, the extracting may further include extracting one or more metadata-features pertaining to a production-line of the material and/or a specific environment of the SEM images. The one or more metadata features may be defined by at least one of a process-parameter, a step-parameter, and an equipment parameter.

Then, at step 206a, the extracted image-features may be classified under one or more predetermined labels. At step 206b, at least one element associated with the defect within the material may be predicted and a corresponding shape of the predicted element may be predicted. The predicting may include execution of an inference phase of a machine-learning module to predict a material-composition of defect within the material based on the extracted image-features and the metadata-features. The prediction may include at least one of prediction of one or more elements to be present within the material, prediction of an elemental-distribution map of the material with respect to the predicted-elements, prediction of a heat-map of the material identifying the predicted-elements through color-codes, and prediction of a distribution of defect elements across the material for defining a map per each predicted element.

The inference phase may be assisted by execution of training phase including the step of training the machine-learning module with a training data including a historically logged EDS spectrum captured for the material.

Further, at step 208, the defect within the material is graded based on comparing the predicted-elements with predetermined criteria. The grading may include monitoring type of defects within the material based on the comparison of the predicted-elements and a database including a pre-defined mapping between the elements and associated defects. Based thereupon, a log of graded defects may be created as a knowledge store to be referred to for further grading of the defects.

The grading may include assessing the severity of the defect and/or a number of occurrences of the defect within the material based on referring to the database including a historical-log of elements and associated defects. The grading may also include identifying a set of candidate materials attributed to occurrence of defects based on parameters pertaining to the process and equipment used for the initial inspection and further inspection. In addition, the grading may include suggesting a remedial-measure in case of the severity of the defect and/or the occurrences of the defect exceeding the threshold.

Figure 2B:
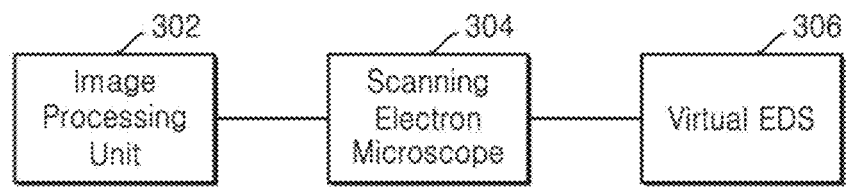

FIG. 2B illustrates an internal-construction of a system 300 in accordance with the example embodiment. The system 300 may include IPU 302 that may be a multimodal computer vision unit and an SEM 304 configured to perform the step 202 in FIG. 2A. Further, the system 300 may include a virtual EDS 306 that is configured to perform the steps 204 through 208 in FIG. 2A. The system may also include a miscellaneous module 308 configured to facilitate operational-interconnection between the multimodal computer-vision unit 302, the SEM 304, and the virtual EDS 306 and perform other ancillary-functions.

The virtual EDS 306 may correspond to at least one of the plurality of modules that may be implemented through an artificial intelligence (AI) model. A function associated with AI may be performed through the non-volatile memory, the volatile memory, and the processor. The processor may include at least one processor. The processor may be a general purpose processor, such as a central processing unit (CPU), an application processor (AP), or the like, a graphics-only processing unit such as a graphics processing unit (GPU), a visual processing unit (VPU), and/or an AI-dedicated processor such as a neural processing unit (NPU).

The processor may be configured to control the processing of the input data in accordance with a predefined operating rule or AI model stored in the non-volatile memory and the volatile memory. The predefined operating rule or AI model is provided through training or learning.

Here, being provided through learning may include that, by applying a learning technique to a plurality of learning data, a predefined operating rule or AI model of a desired characteristic is made. The learning may be performed in a device itself in which AI according to an example embodiment is performed, and/or may be implemented through a separate server/system.

The AI model may consist of a plurality of neural network layers. Each layer has a plurality of weight values, and performs a layer operation through calculation of a previous layer and an operation of a plurality of weights. Examples of neural networks include, but are not limited to, convolutional neural network (CNN), deep neural network (DNN), recurrent neural network (RNN), restricted Boltzmann Machine (RBM), deep belief network (DBN), bidirectional recurrent deep neural network (BRDNN), generative adversarial networks (GAN), and deep Q-networks.

The learning technique is a method for training a predetermined target device, for example, a robot using a plurality of learning data to cause, allow, or control the target device to make a determination or prediction. Examples of learning techniques include, but are not limited to, supervised learning, unsupervised learning, semi-supervised learning, or reinforcement learning.

As a part of the virtual EDS (VEDS) system 306 configured to predict defect material composition from SEM images, inference may be made at least based on the SEM images, thereby being non-destructive. In an example, the inference may be multi-label that provides all the elements present in the defect.

The input defects may have random shape, size and texture. The defects may not have discernible physical regions associated with specific-labels. The VEDS 306 may predict the defects with high accuracy and overcome issues with the related EDS system. The training may use the meta-information of the defect occurrence step.

Figure 3:
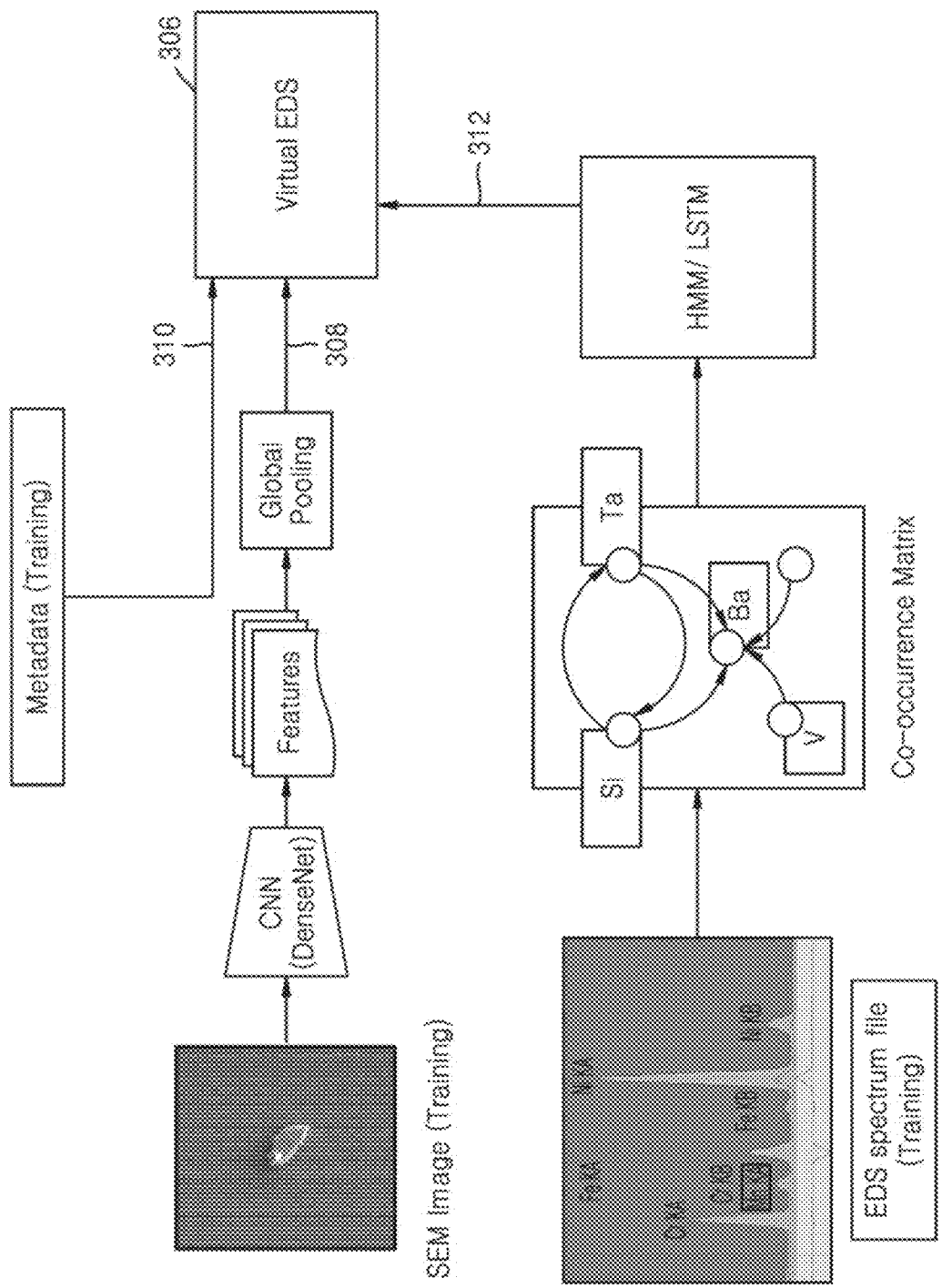
FIG. 3 illustrates steps of a training phase in accordance with an example embodiment.

Now referring to FIG. 3, a training phase is illustrated in accordance with an example embodiment. The training phase may be defined as training the machine-learning module with a training data defined by an SEM image 308, a historically logged EDS spectrum captured for the material 312, and optionally metadata 310. Metadata 310 may be a process step, equipment ID, lot ID, process conditions, process materials etc.

In an example, in each of the SEM images, each of the defect images are obtained in groups of line-step-process combinations. Metadata strings are used to identify the specific environments of defect images. Along with the image-based latent variables, the metadata is optionally used in the training and helps augment prediction accuracy.

In an example, as of generating the training data set, data augmentation may be adopted. Programmatic data augmentation increases the size of input dataset. By applying transformations like rotations, horizontal flip, vertical flip operations may be performed to increase the number of original images to extended images. The increased number of images may be used for training and testing.

In an example, the AI model undergoing may be a combination of CNN Densenet, HMM, LSTM, RNN, RBM, DBN, BRDNN, GAN, and deep Q-networks.

Figure 4:
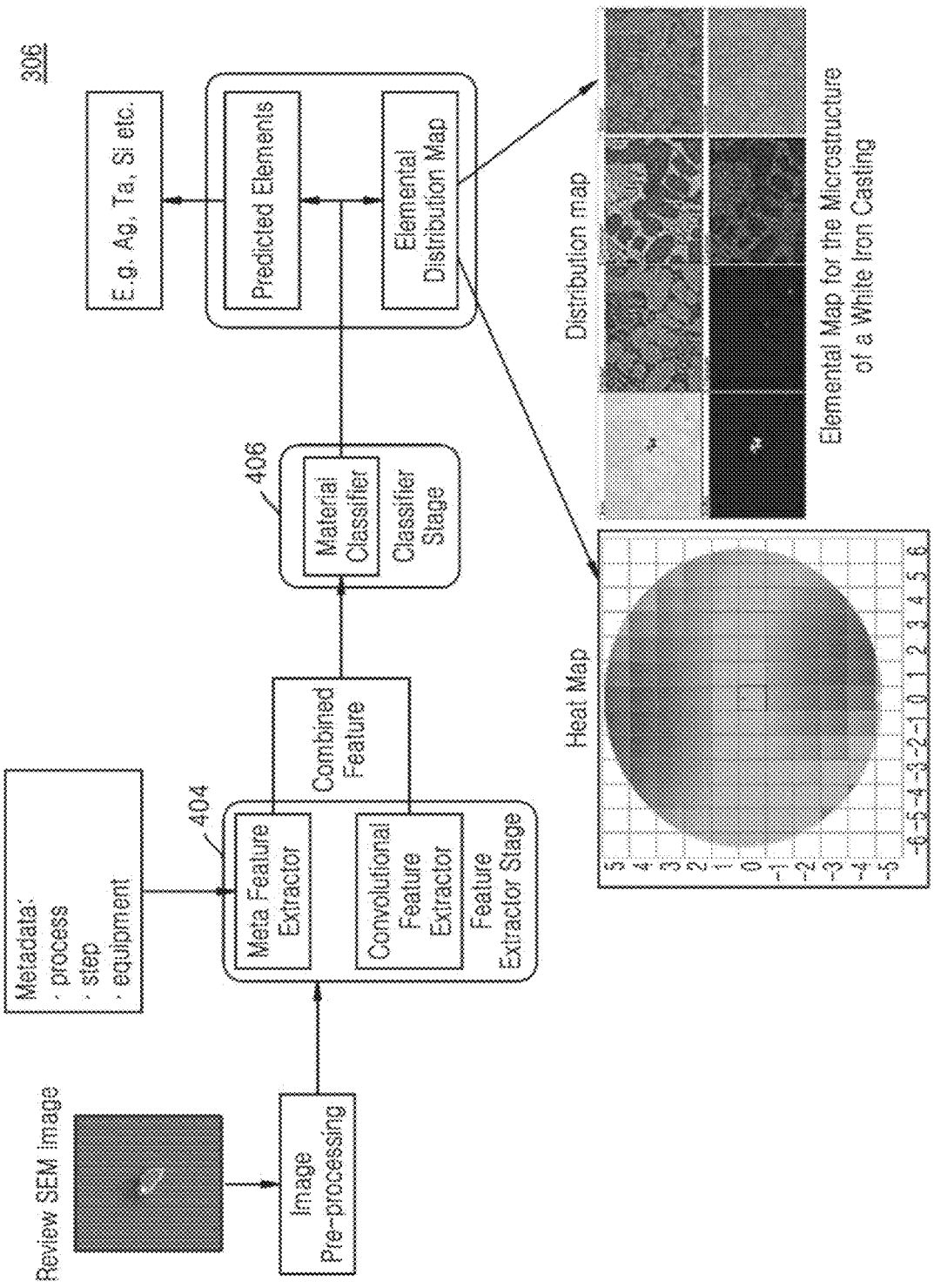
FIG. 4 illustrates steps of an inference phase in accordance with an example embodiment.

Referring to FIG. 4, an inference phase for the virtual EDS 306 is illustrated according to an example embodiment. The steps precursor to the inference phase corresponds to image pre-processing steps.

As a part of image pre-processing 402, an image processing library may be used for both image pre-processing and finding contours. Sub-steps of operation for image pre-processing 402 may include converting RGB image to HSV image, creating a mask on region of interest (ROI) of HSV image, and using a filter to extract the object. The image pre-processing 402 may also include obtaining an HSV image based on bistwise and mask, converting the HSV image to threshold-image. Thresholding may be method for image segmentation.

The image pre-processing 402 may also include obtaining and sorting contours to find the largest one based on the contour area. Contours may be (x,y) coordinates of a boundary of a shape with same intensity.

The SEM image may be pre-processed to be converted into a modified SEM image, for example, based on a super-resolution based pre-processing, to extract substantially finer image-features than a standard EDS system.

As a part of inference phase, the trained machine-learning model developed with relevant features from the designed dataset as depicted in FIG. 3 may be used. In an example, the trained model may be CNNs that are multilayer neural networks where the layers are stacked. The CNN may include an input layer, an output layer, and multiple hidden layers between the input layer and the output layer. The hidden layers are convolutional, pooling or fully connected.

The feature extraction step 404 may include passing the pre-processed images through the filters to learn features from the image and derive values, for example, through dimensionality reduction, to facilitate subsequent-learning and generalization. The output is a feature map. Thereafter, the pooling step reduces the dimensionality but retains the important information from the feature map. Accordingly, the convolutional layer and the pooling operate as feature extraction layers. While the feature extraction step 404 may be illustrated with respect to convolution-layers to extract features, the feature extraction step 404 may be expanded to cover other general dimensionality reduction techniques such as independent component analysis, Isomap, kernel principal component analysis (PCA), latent semantic analysis, partial least squares, PCA.

The image features may be combined with the metadata features and sent to a classifier to be classified under one or more labels. The one or more metadata features may be a production-line of the material and/or a specific environment of the SEM images, and defined by at least one of a process-parameter, a step-parameter, and an equipment parameter.

In the classifier step 406, a fully connected (FC) layer may be followed by a sigmoid layer. In the FC layer, every neuron in the previous layer is connected to every neuron in the next layer. The FC Layer with sigmoid activation function use features from the convolution layer and the pooling layer, and classifies the input image into multiple labels based on the training dataset.

Based on said multi-label classification, a material-composition of defect within the input material, for example, silicon wafer, may be predicted based on the extracted image-features and the metadata-features. The prediction is defined as prediction of one or more elements predicted to be present within the material. In an example, the predicted elements may be chromium (Cr), nickel (Ni), cobalt (Co), silver (Ag), tantalum (Ta), silicon (Si), etc.

Other type of prediction may include prediction of an elemental-distribution map of the material with respect to the predicted-elements. Such distribution of materials may also be predicted as a heat-map of the material identifying the predicted-elements through color-codes. The knowledge of the composition of the defects may be used to generate a heat map/wafer defect map. Accordingly, the location of the defects, for example, chromium/aluminum bearing defects, within the wafer may be ascertained. However, embodiments are not limited thereto. For example, predicting distribution of defect elements across the material for defining a map per predicted element may be performed.

Figure 5:
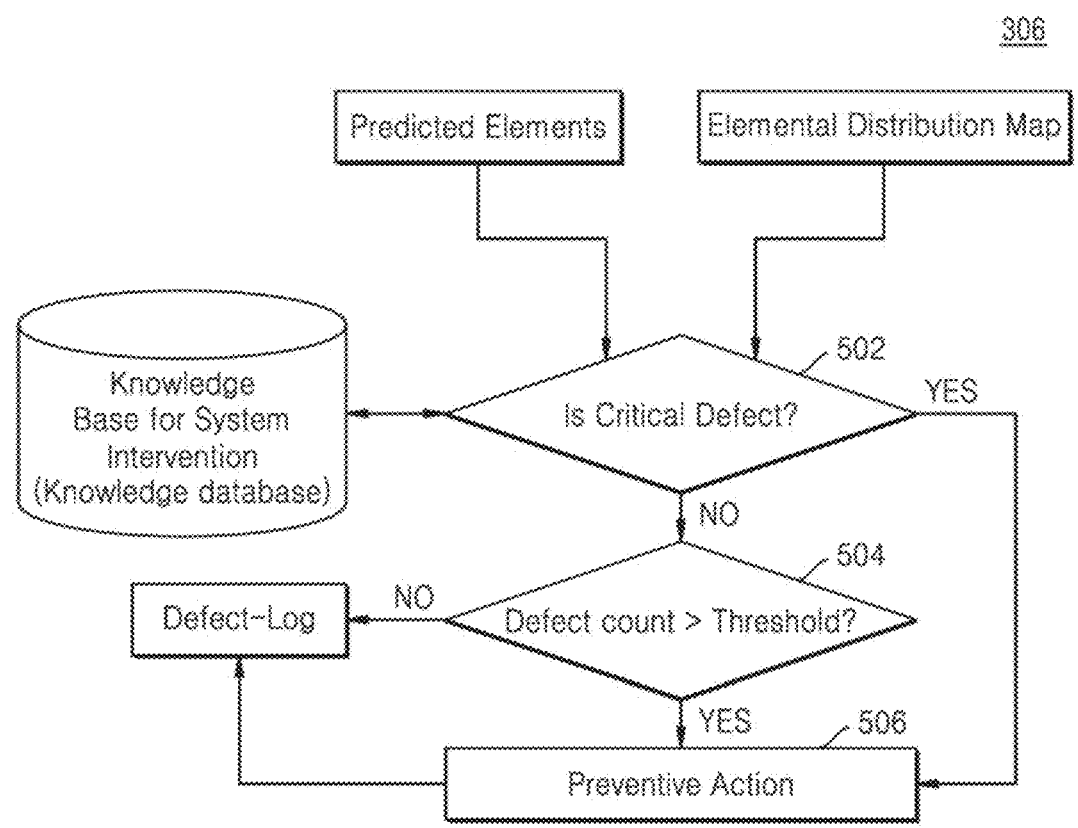
FIG. 5 illustrates steps of an inference phase in accordance with an example embodiment.

Referring to FIG. 5, the virtual EDS may be configured to log the identified elements and the distribution map associated with identified elements, and also grade the identified defects. The type of defects as within the material or a part of material composition (MC) are identified based on the comparison of the predicted-elements/map and a knowledge database DB. Such database may be a historically drawn mapping between the elements and associated defects. In addition, the knowledge database may also maintain a log of graded-defects as a knowledge store to refer to for further grading of the defects.

Further, at step 502, the severity of the defects and/or a number of occurrences of the defects within the material may be assessed based on a predetermined threshold. For example, the severity of a defect may be assessed either based on referring to the database including a historical-log of elements and associated defect. As another example, a quantum of otherwise moderate or normal defects exceeding threshold value may also be reported as a severe defect (step 504). In both examples, a remedial measure or preventive measure to rectify, cure, and/or mitigate the severe defects are recommended (step 506).

FIG. 6 illustrates the precision, recall and F1 score related to the identification of the materials as obtained through the VEDS system according to an example embodiment. As shown in FIG. 6, an average F1 score related to the image identification/classification and identified/classified elements may be 0.75

Figure 7:
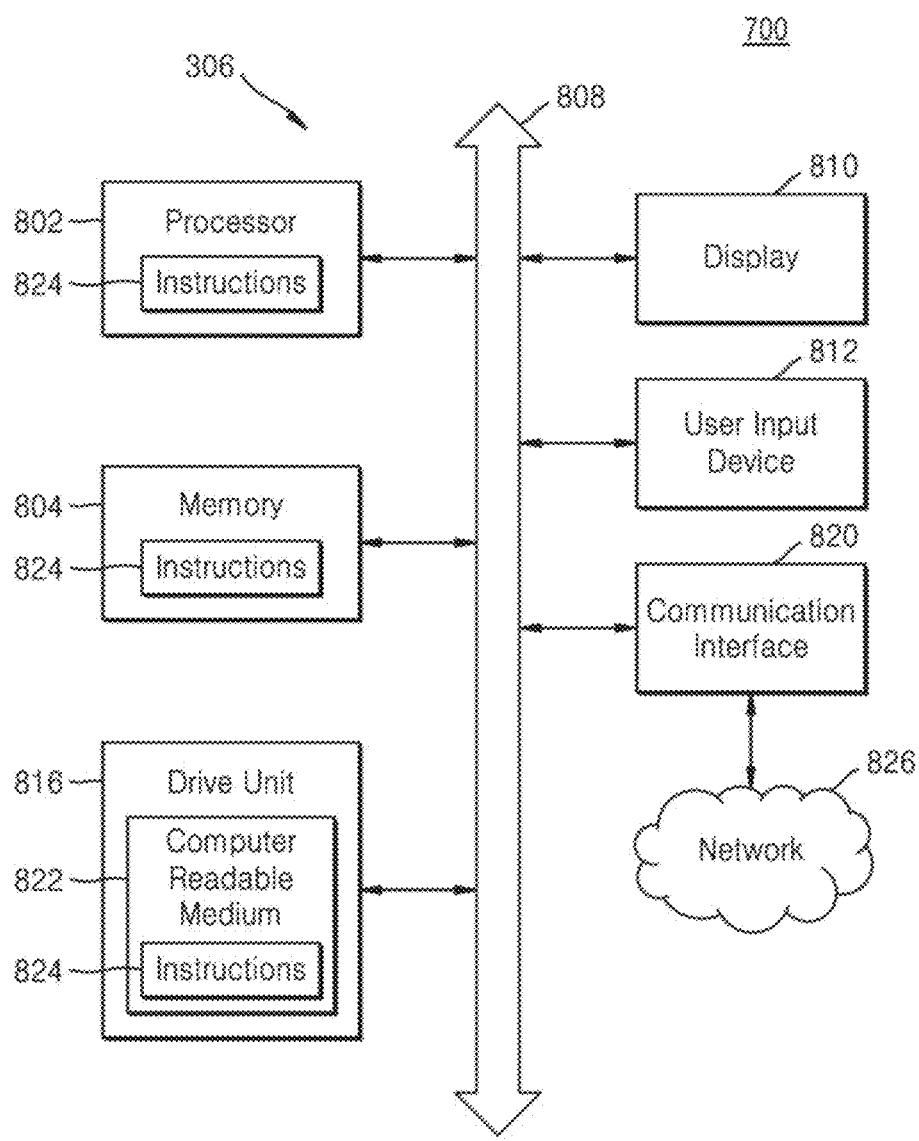
FIG. 7 illustrates an example computing-device based implementation of the method as illustrated in FIGS. 2A and 2B in accordance with an example embodiment.

FIG. 7 illustrates another example embodiment of a hardware configuration of the system 306 in the form of a computer-system 800. The computer system 800 may include a set of instructions that may be executed to cause the computer system 800 to perform any one or more of the methods according to example embodiments. The computer system 800 may operate as a standalone-device or may be connected, for example, using a network, to other computer systems or peripheral devices.

In a networked deployment, the computer system 800 may operate in the capacity of a server or as a client user computer in a server-client user network environment, or as a peer computer system in a peer-to-peer or distributed network environment. The computer system 800 may also be implemented as or incorporated across various devices, such as a personal computer (PC), a tablet PC, a personal digital assistant (PDA), a mobile device, a palmtop computer, a laptop computer, a desktop computer, a communications device, a wireless telephone, a land-line telephone, a web appliance, a network router, switch or bridge, or any other machine capable of executing a set of instructions (sequential or otherwise) that specify actions to be taken by that machine. Further, while a single computer system 800 is illustrated, the term system shall also be taken to include any collection of systems or sub-systems that individually or jointly execute a set, or multiple sets, of instructions to perform one or more computer functions.

The computer system 800 may include a processor 802, for example, a CPU, a GPU, or both. The processor 802 may be a component in a variety of systems. For example, the processor 802 may be part of a standard personal computer or a workstation. The processor 802 may be one or more general processors, digital signal processors, application specific integrated circuits, field programmable gate arrays, servers, networks, digital circuits, analog circuits, combinations thereof, or other now known or later developed devices for analysing and processing data. The processor 802 may implement a software program, such as a programmed code that is generated manually.

The computer system 800 may include a memory 804, such as a memory 804 that can communicate via a bus 808. The memory 804 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In an example embodiment, the memory 804 includes a cache or random access memory for the processor 802. The memory 804 may be separate from the processor 802, such as a cache memory of a processor, the system memory, or other memory. The memory 804 may be an external storage device or database for storing data. The memory 804 is operable to store instructions executable by the processor 802. The functions, acts or tasks illustrated in the figures or described may be performed by the programmed processor 802 for executing the instructions stored in the memory 804. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing, etc.

As shown, the computer system 800 may include a display unit 810, such as a liquid crystal display (LCD), an organic light emitting diode (OLED), a flat panel display, a solid state display, a cathode ray tube (CRT), a projector, a printer or other now known or later developed display device for outputting determined information. The display 810 may act as an interface for the user to view the functioning of the processor 802, or specifically as an interface with the software stored in the memory 804 or in the drive unit 1016.

Additionally, the computer system 800 may include an input device 812 configured to allow a user to interact with any of the components of system 800. The computer system 800 may also include a disk or optical drive unit 816. The disk drive unit 816 may include a computer-readable medium 822 in which one or more sets of instructions 824, for example, software, may be embedded. Further, the instructions 824 may embody one or more of the methods or logic as described. In a particular example, the instructions 824 may reside completely, or at least partially, within the memory 804 or within the processor 802 during execution by the computer system 800.

The computer system 800 may include a computer-readable medium that includes instructions 824 or receives and executes instructions 824 responsive to a propagated signal so that a device connected to a network 826 can communicate voice, video, audio, images or any other data over the network 826. Further, the instructions 824 may be transmitted or received over the network 826 via a communication port or interface 820 or using a bus 808. The communication port or interface 820 may be a part of the processor 802 or may be a separate component. The communication port 820 may be created in software or may be a physical connection in hardware. The communication port 820 may be configured to connect with a network 826, external media, the display 810, or any other components in the computer system 800, or combinations thereof. The connection with the network 826 may be a physical connection, such as a wired Ethernet connection or may be established wirelessly. The additional connections with other components of the system 800 may be physical connections or may be established wirelessly. The network 826 may alternatively be directly connected to the bus 808.

The network 826 may include wired networks, wireless networks, Ethernet AVB networks, or combinations thereof. The wireless network may be a cellular telephone network, an 802.11, 802.16, 802.20, 802.1Q or WiMax network. Further, the network 826 may be a public network, such as the Internet, a private network, such as an intranet, or combinations thereof, and may utilize a variety of networking protocols now available or later developed including, but not limited to TCP/IP based networking protocols. The system is not limited to operation with any particular standards and protocols. For example, standards for Internet and other packet switched network transmission (e.g., TCP/IP, UDP/IP, HTML, HTTP) may be used.

The virtual EDS system according to example embodiments may provide analysis that is extension of review SEM and may be integrated to in-line process and where all review SEM images are analyzed exhaustively to improve defect coverage. Further, according to the virtual EDS system according to example embodiments, the inference may occur within a short amount of time such as within seconds, and images of small defects may be enhanced and the features learnt from larger defect images may be applied. In addition, according to the virtual EDS system according to example embodiments, the relevant defect regions may be auto-focused through review SEM, and the system automatically intervenes based on prior knowledge base. The virtual EDS system according to example embodiments may provide computer enabled solution, one-time deployment, no or low maintenance cost, and provide a non-destructive system.

While example embodiments have been described, various working modifications may be made to the method in order to implement example embodiments.

The drawings and the foregoing description are examples, and one or more of the described elements may well be combined into a single functional element. Certain elements may be split into multiple functional elements. Elements from one example embodiment may be added to another embodiment. For example, orders of processes described herein may be changed and are not limited to the manner described herein.

Moreover, the actions of any flow diagram need not be implemented in the order shown; nor do all of the acts necessarily need to be performed. Also, those acts that are not dependent on other acts may be performed in parallel with the other acts. The scope of example embodiments is by no means limited by these specific examples. Numerous variations, whether explicitly given in the specification or not, such as differences in structure, dimension, and use of material, are possible.

Benefits, other advantages, and solutions to problems have been described above with regard to example embodiments. However, the benefits, advantages, solutions to problems, and any component(s) that may cause any benefit, advantage, or solution to occur or become more pronounced are not to be construed as a critical, required, or essential feature or component of any or all the claims.

While example embodiments have been described with reference to the figures, it will be understood by those of ordinary skill in the art that various changes in form and details may be made therein without departing from the spirit and scope as defined by the following claims.

What is claimed is:

1. A method for virtually executing an operation of an energy dispersive x-ray spectrometry (EDS) system in real time production line by analyzing a defect included in a material undergoing inspection based on computer vision, the method comprising:
   receiving a scanning electron microscope (SEM) image of the material comprising the defect;
   extracting an image-feature from the SEM image of the material;

classifying the extracted image-feature under a predetermined label;
predicting, based on the classified image-feature, an element associated with the defect included in the material and a shape of the predicted element; and
grading the defect included in the material based on comparing the predicted element with a predetermined criteria.

2. The method as claimed in claim 1, wherein the grading comprises:
monitoring a type of the defect included in the material based on comparison between the predicted element and a database including a predetermined mapping between elements and associated defects; and
creating a log of graded defects to be used in grading other defects.

3. The method as claimed in claim 1, further comprising:
selecting a wafer for inspection to identify the defect included in the wafer as an initial inspection;
communicating the wafer and the identified defect to an SEM producing the SEM image;
irradiating the material comprising the identified defect with an electron-beam by the SEM for further inspection; and
detecting electrons generated from the material in response to the electron-beam to generate the SEM image.

4. The method as claimed in claim 3, wherein the irradiating comprises irradiating the material by an electro-optic system configured to radiate the electron-beam on the material,
wherein the method further comprises:
detecting secondary electrons by a secondary-electron detector configured to detect the secondary electrons generated from the material in response to the electron-beam; and
generating the SEM image.

5. The method as claimed in claim 3, further comprising:
pre-processing the SEM image to convert the SEM image to a modified SEM image based on at least one of:
image enhancement based pre-processing; and
estimation of defect-height based on image processing.

6. The method as claimed in claim 1, wherein the extracting the image-feature comprises executing a deep learning framework or a machine learning framework to extract the image-feature by determining contour-features comprising area, perimeter, centroid, and bounding box.

7. The method as claimed in claim 1, further comprising:
extracting at least one of a meta-data feature of a production-line of the material and a specific environment of the SEM image, the meta-data feature including at least one of a process-parameter, a step-parameter, and an equipment parameter.

8. The method as claimed in claim 1, wherein the predicting comprises an execution of an inference phase of a machine-learning module to predict a material-composition of the defect included in the material based on the extracted image-feature and meta-data feature classified under the predetermined label, the predicting including at least one of:
predicting the element included in the material;
predicting an elemental-distribution map of the material with respect to the predicted element;
predicting a heat-map of the material identifying the predicted element based on color-codes; and
predicting a distribution of the element associated with the defect in the material based on the predicted element.

9. The method as claimed in claim 8, wherein the machine-learning module is configured to be trained based on a historically logged EDS spectrum corresponding to the material.

10. The method as claimed in claim 3, wherein the grading comprises:
determining at least one of a severity of the defect and a number of occurrences of the defect included in the material based on a database comprising a historical-log of elements and associated defects;
identifying a set of candidate materials attributed to occurrence of the defect based on a parameter of a process and equipment of the initial inspection and further inspection; and
suggesting a remedial-measure based on at least one of the severity and the number of occurrences of the defect exceeding a threshold.

* * * * *